(12) United States Patent
Lin et al.

(10) Patent No.: US 12,224,322 B2
(45) Date of Patent: Feb. 11, 2025

(54) EPITAXIAL STRUCTURE HAVING DIFFUSION BARRIER LAYER

(71) Applicant: GlobalWafers Co., Ltd., Hsinchu (TW)

(72) Inventors: Tzu-Yao Lin, Hsinchu (TW); Jia-Zhe Liu, Hsinchu (TW); Ying-Ru Shih, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 267 days.

(21) Appl. No.: 17/238,311

(22) Filed: Apr. 23, 2021

(65) Prior Publication Data
US 2021/0336011 A1    Oct. 28, 2021

(30) Foreign Application Priority Data

Apr. 24, 2020   (TW) ................... 109113719

(51) Int. Cl.
*H01L 29/205*   (2006.01)
*H01L 29/20*    (2006.01)
*H01L 29/778*   (2006.01)

(52) U.S. Cl.
CPC ........ *H01L 29/205* (2013.01); *H01L 29/2003* (2013.01); *H01L 29/7786* (2013.01)

(58) Field of Classification Search
CPC ............... H01L 29/205; H01L 29/2003; H01L 29/7786; H01L 21/02458; H01L 21/02505;
(Continued)

(56) References Cited

U.S. PATENT DOCUMENTS 10,797,168 B1 *  10/2020  Moens ............. H01L 29/66462
2019/0237550 A1 *  8/2019  Uesugi ................. H01L 29/207
(Continued)

FOREIGN PATENT DOCUMENTS

JP        2004342810 A    12/2004
TW        I416597 B       11/2013
(Continued)

OTHER PUBLICATIONS

Mojaver et al., Use of a bilayer lattice-matched AlInGaN barrier for improving the channel carrier confinement of u enhancement-mode AlInGaN/GaN hetero-structure field-effect transistors, 2017, Journal of Applied Physics, 121, 244502 (Year: 2017).*
(Continued)

*Primary Examiner* — Kimberly N Rizkallah
*Assistant Examiner* — Zhijun Xu
(74) *Attorney, Agent, or Firm* — Li & Cai Intellectual Property (USA) Office (57) ABSTRACT

An epitaxial structure includes a substrate, a buffer layer, a channel layer, a barrier layer, a diffusion barrier layer, and a P-type gallium nitride layer sequentially stacked from bottom to top. The P-type gallium nitride layer has a first lattice constant. The diffusion barrier layer includes a chemical composition of $In_{x1}Al_{y1}Ga_{z1}N$, where $x1+y1+z1=1$, $0 \leq x1 \leq 0.3$, $0 \leq y1 \leq 1.0$, and $0 \leq z1 \leq 1.0$. The chemical composition of the diffusion barrier layer has a proportional relationship so that the diffusion barrier layer has a second lattice constant that matches the first lattice constant, and the second lattice constant is between 80% and 120% of the first lattice constant.

7 Claims, 6 Drawing Sheets

(58) Field of Classification Search
CPC ........... H01L 21/0251; H01L 21/02579; H01L 29/1066; H01L 29/201; H01L 21/0254; H01L 21/02581
See application file for complete search history.

(56) References Cited

U.S. PATENT DOCUMENTS

2020/0027872 A1* 1/2020 Boles ................ H01L 21/02381
2021/0050422 A1* 2/2021 Liu ....................... H01L 29/155

FOREIGN PATENT DOCUMENTS

TW        I491043 B      7/2015
TW        201947766 A    12/2019

OTHER PUBLICATIONS

B Reuters, et al., "Fabrication of p-channel heterostructure field effect transistors with polarization-induced two-dimensional hole gases at metal-polar GaN/AlInGaN interfaces"; 2J. Phys. D: Appl. Phys. 47 (2014) 175103, 2014.

* cited by examiner

EPITAXIAL STRUCTURE HAVING DIFFUSION BARRIER LAYER

CROSS-REFERENCE TO RELATED PATENT APPLICATION

This application claims the benefit of priority to Taiwan Patent Application No. 109113719, filed on Apr. 24, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an epitaxial structure, and more particularly to an epitaxial structure suitable for use in radio frequency (RF) components or power components.

BACKGROUND OF THE DISCLOSURE

Since a conventional semiconductor epitaxial structure has advantages of high purity and good thickness controllability, the conventional semiconductor epitaxial structure has been widely used in radio frequency (RF) components or power components.

However, the conventional semiconductor epitaxial structure affects an electronic behavior in a channel layer (channel GaN) due to a deeper diffusion depth of an acceptor doping element, such as Mg. Furthermore, the conventional semiconductor epitaxial structure is difficult to control an etching rate of a P-type gallium nitride layer. If an etching depth is too deep, an active layer may be damaged, thereby affecting device characteristics of the power component.

SUMMARY OF THE DISCLOSURE

In response to the above-referenced technical inadequacies, the present disclosure provides an epitaxial structure.

In one aspect, the present disclosure provides an epitaxial structure which includes a substrate, a buffer layer, a channel layer, a barrier layer, and a P-type gallium nitride layer. The buffer layer is disposed on the substrate, the channel layer is disposed on the buffer layer, the barrier layer is disposed on the channel layer, the P-type gallium nitride layer is disposed on the barrier layer, and the P-type gallium nitride layer has a first lattice constant. The epitaxial structure further includes a diffusion barrier layer disposed between the barrier layer and the P-type gallium nitride layer. The diffusion barrier layer includes a chemical composition of $In_{x1}Al_{y1}Ga_{z1}N$, where $x1+y1+z1=1$, $0 \leq x1 \leq 0.3$, $0 \leq y1 \leq 1.0$, and $0 \leq z1 \leq 1.0$. The chemical composition of the diffusion barrier layer has a proportional relationship, so that the diffusion barrier layer has a second lattice constant that matches the first lattice constant, and the second lattice constant is between 80% and 120% of the first lattice constant.

Therefore, by virtue of "a diffusion barrier layer being disposed between the barrier layer and the P-type gallium nitride layer, the diffusion barrier layer including a chemical composition of $In_{x1}Al_{y1}Ga_{z1}N$, where $x1+y1+z1=1$, $0 \leq x1 \leq 0.3$, $0 \leq y1 \leq 1.0$, and $0 \leq z1 \leq 1.0$; in which the chemical composition of the diffusion barrier layer has a proportional relationship, so that the diffusion barrier layer has a second lattice constant that matches the first lattice constant, and the second lattice constant is between 80% and 120% of the first lattice constant", the epitaxial structure of the present disclosure enables an internal stress between the diffusion barrier layer and the P-type gallium nitride layer to be effectively reduced, and the epitaxial structure can have good epitaxial quality, thereby having good electrical characteristics.

Furthermore, the epitaxial structure of the present disclosure can achieve a diffusion barrier (i.e., blocking the diffusion of Mg atoms to the channel layer) and an etching stop effect (i.e., avoiding damage to the channel layer due to excessive etching depth), thereby effectively improving the component characteristics of power components.

By virtue of "the diffusion barrier layer and the modulation of chemical composition $In_{x1}Al_{y1}Ga_{z1}N$", the epitaxial structure of the present disclosure enables Mg atoms to be not easily diffused into the active layer in large quantities, and the higher etching uniformity and stability at the device manufacturing process can also be achieved due to the difference in etching rate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
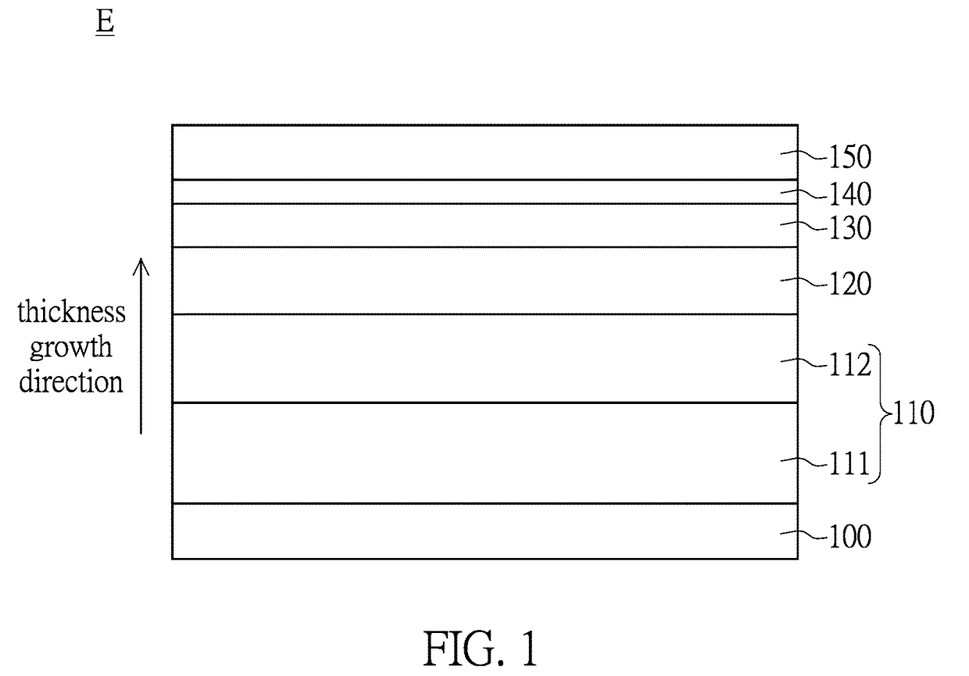
FIG. 1 is a schematic cross-sectional view of an epitaxial structure according to an embodiment of the present disclosure.

Referring to FIG. 1, FIG. 1 is a schematic cross-sectional view of an epitaxial structure E according to an embodiment of the present disclosure. The epitaxial structure E of the present embodiment includes a substrate 100, a buffer layer 110, a channel layer 120, a barrier layer 130, a diffusion barrier layer 140, and a P-type gallium nitride layer 150 (p-GaN layer).

The epitaxial structure E of the present embodiment is particularly suitable for application in a radio frequency (RF) component or a power component, but the present disclosure is not limited thereto. For example, the power component may be, for example, an enhanced (E-mode) power component.

The substrate 100 is a bottom layer of the epitaxial structure E. The buffer layer 110 is disposed on a side surface of the substrate 100. The channel layer 120 is disposed on a side surface of the buffer layer 110 away from the substrate 100. The barrier layer 130 is disposed on a side surface of the channel layer 120 away from the buffer layer 110. The diffusion barrier layer 140 is disposed on a side surface of the barrier layer 130 away from the channel layer 120. In addition, the P-type gallium nitride layer 150 is disposed on a side surface of the diffusion barrier layer 140 away from the barrier layer 130.

That is, the diffusion barrier layer 140 is disposed between the barrier layer 130 and the P-type gallium nitride layer 150, and the P-type gallium nitride layer 150 is a top layer of the epitaxial structure E.

The P-type gallium nitride layer 150 has a first lattice constant, the diffusion barrier layer 140 has a second lattice constant, and the second lattice constant matches the first lattice constant.

More specifically, the diffusion barrier layer 140 includes a chemical composition of $In_{x1}Al_{y1}Ga_{z1}N$, where $x1+y1+z1=1$, $0 \leq x1 \leq 0.3$, $0 \leq y1 \leq 1.0$, and $0 \leq z1 \leq 1.0$. Among them, x1 represents indium (In) content, y1 represents aluminum (Al) content, and z1 represents gallium (Ga) content.

Furthermore, the nitrogen (N) content of the above-mentioned chemical composition is a fixed value. A ratio of a sum of the indium (In) content, the aluminum (Al) content and the gallium (Ga) content relative to the nitrogen (N) content may be, for example, 1:1, but the present disclosure is not limited thereto.

The chemical composition of the diffusion barrier layer 140 has a specific proportional relationship, so that the second lattice constant of the diffusion barrier layer 140 matches the first lattice constant of the P-type gallium nitride layer 150. Specifically, the second lattice constant of the diffusion barrier layer 140 is usually between 80% and 120% of the first lattice constant of the P-type gallium nitride layer 150, preferably between 90% and 110%, and more preferably between 95% and 105%.

In the present embodiment, the first lattice constant of the P-type gallium nitride layer 150 is 3.2±0.3 Å, and the second lattice constant of the diffusion barrier layer 140 is 3.2±0.3 Å.

Generally, a lattice in a three-dimensional space has three lattice constants, which are represented by a value, b value, and c value, respectively. In the present embodiment, the first and second lattice constants mentioned above all refer to the "a value" of the lattice constants of the material at a room temperature (i.e., 300K), but the present disclosure is not limited thereto.

In the diffusion barrier layer 140, the proportional relationship of the chemical composition is that: y1 and x1 satisfy the following relationship: $y1=k1*x1$, where $2 \leq k1 \leq 8$, preferably $2.5 \leq k1 \leq 8$, and more preferably $3.5 \leq k1 \leq 5$; and y1 and z1 satisfy the following relationship: $y1*z1=k2$, where $0.05 \leq k2 \leq 0.3$, preferably $0.07 \leq k2 \leq 0.20$, and more preferably $0.10 \leq k2 \leq 0.15$.

In other words, the aluminum (Al) content is 2 to 8 times of the indium (In) content, preferably 2.5 to 8 times, and more preferably 3.5 to 5 times. In addition, a product value of the aluminum (Al) content multiplied by the gallium (Ga) content is between 0.05 and 0.3, preferably between 0.07 and 0.20, and more preferably between 0.10 and 0.15.

According to the proportional relationship of the chemical composition, the diffusion barrier layer 140 can have a good lattice matching with the P-type gallium nitride layer 150, so that an internal stress between the diffusion barrier layer 140 and the P-type gallium nitride layer 150 can be effectively reduced, and the epitaxial structure E can have good epitaxial quality, thereby having good electrical characteristics.

In the present embodiment, at least a part of the aluminum content of the diffusion barrier layer 140 is greater than the aluminum content of the barrier layer 130. For example, the aluminum content of the entire diffusion barrier layer 140 is greater than the aluminum content of the barrier layer 130, but the present disclosure is not limited thereto. Changes in the aluminum content of the diffusion barrier layer 140 and changes in the content of other compositions will be described in detail below.

More specifically, the barrier layer 130 includes a chemical composition of $Al_{y2}Ga_{z2}N$, where $y2+z2=1$, $0.1 \leq y2 \leq 0.3$, and $0 \leq z2 \leq 1$. Among them, y2 represents aluminum (Al) content, and z2 represents gallium (Ga) content.

Furthermore, the aluminum (Al) content y2 of the entire barrier layer 130 is between 0.1 and 0.3 (that is, between 10% and 30%), and a maximum value of the aluminum (Al) content y1 of the diffusion barrier layer 140 is not less than 0.4 (that is, not less than 40%).

Accordingly, the maximum value of the aluminum (Al) content in the diffusion barrier layer 140 enables a maximum energy gap of the diffusion barrier layer 140 to be not less than 4.6 eV, preferably between 4.6 eV and 5.2 eV, and more preferably between 4.8 eV and 5.2 eV.

According to the above configuration, the diffusion barrier layer 140 has a higher aluminum (Al) content and a higher energy gap than that of the barrier layer 130, so that the diffusion barrier layer 140 can achieve diffusion barrier (i.e., blocking the diffusion of Mg atoms to the channel layer 120) and stopping etching (i.e., avoiding damage to the channel layer 120 due to excessive etching depth).

Referring further to FIG. 1, the substrate 100 may be, for example, a silicon (Si) substrate, an aluminum oxide ($Al_2O_3$) substrate, a silicon carbide (SiC) substrate, a gallium arsenide (GaAs) substrate, or other suitable substrates. The material of the buffer layer 110 may be, for example, aluminum nitride (AlN) or gallium nitride (GaN).

Furthermore, the buffer layer 110 may be further divided into a first buffer layer 111 and a second buffer layer 112. The first buffer layer 111 is disposed on the substrate 100, and the second buffer layer 112 is disposed on the first buffer layer 111 and disposed under the channel layer 120.

Furthermore, the material of the first buffer layer 111 may be, for example, aluminum nitride (AlN). The material of the second buffer layer 112 may be, for example, gallium nitride (GaN), and the second buffer layer 112 may be, for example, doped with a doping element (i.e., carbon element or iron element), but the present disclosure is not limited thereto.

The material of the channel layer 120 may be, for example, gallium nitride (GaN), aluminum nitride (AlN), indium nitride (InN), or aluminum gallium indium nitride (AlGaInN). In the present embodiment, the material of the channel layer 120 is preferably gallium nitride (GaN).

In addition, the material types of the above-mentioned barrier layer 130, diffusion barrier layer 140, and P-type gallium nitride layer 150 (p-GaN layer) have been mentioned above, and will not be reiterated herein.

The epitaxial structure E of the present embodiment can provide a diffusion barrier (i.e., blocking the diffusion of Mg atoms to the channel layer) by disposing the diffusion barrier layer 140 between the barrier layer 130 and the P-type gallium nitride layer 150. The epitaxial structure E of the present embodiment can also provide an etching stop effect (i.e., avoiding damage to the channel layer due to excessive etching depth).

Furthermore, since the chemical composition of the diffusion barrier layer 140 has a specific proportional relationship, the diffusion barrier layer 140 can have a good lattice matching with the P-type gallium nitride layer 150. Therefore, an internal stress between the diffusion barrier layer 140 and the P-type gallium nitride layer 150 can be effectively reduced, and the epitaxial structure E can have good epitaxial quality, thereby having good electrical characteristics.

Referring to FIG. 2A to FIG. 6A, changes in the content of the chemical composition of a partial of the epitaxial structure of the above-mentioned embodiment along a thickness growth direction are illustrated, respectively. More specifically, the aluminum (Al) content, the indium (In) content, and the gallium (Ga) content in the diffusion barrier layer 140 along the thickness growth direction are illustrated, respectively. The P-type gallium nitride layer 150 in the drawing is a gallium nitride layer that does not contain aluminum (Al).

Referring to FIG. 2B to FIG. 6B, changes in the lattice constant and energy gap of the partial of the epitaxial structure of the above-mentioned embodiment along the thickness growth direction are illustrated, respectively.

Figure 2A:
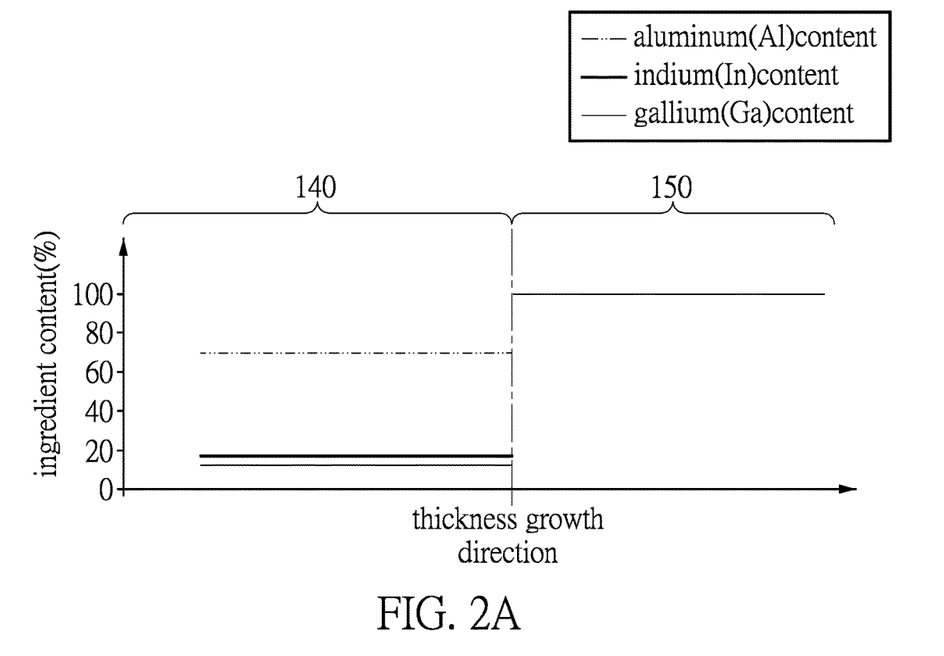
FIG. 2A is a schematic diagram of a first content variation of a chemical composition of a partial of the epitaxial structure of the embodiment along a thickness growth direction.

As shown in FIG. 2A, in the diffusion barrier layer 140, the aluminum (Al) content, the indium (In) content, and the gallium (Ga) content are all fixed values. The aluminum (Al) content is usually between 40% and 100%, preferably between 60% and 80%, and more preferably between 69% and 71%.

The indium (In) content is usually between 0% and 30%, preferably between 5% and 20%, and more preferably between 14% and 16%. The gallium (Ga) content is usually between 0% and 30%, preferably between 5% and 20%, and more preferably between 14% and 16%.

It should be noted that, the content unit "%" of the aluminum (Al) content, the indium (In) content or the gallium (Ga) content mentioned in the present article refers to "atomic concentration (at. %)".

The diffusion barrier layer 140 is a single-layer structure, and a total thickness of the diffusion barrier layer 140 is preferably between 1 nanometer and 10 nanometers, and more preferably between 1 nanometer and 5 nanometers.

Figure 2B:
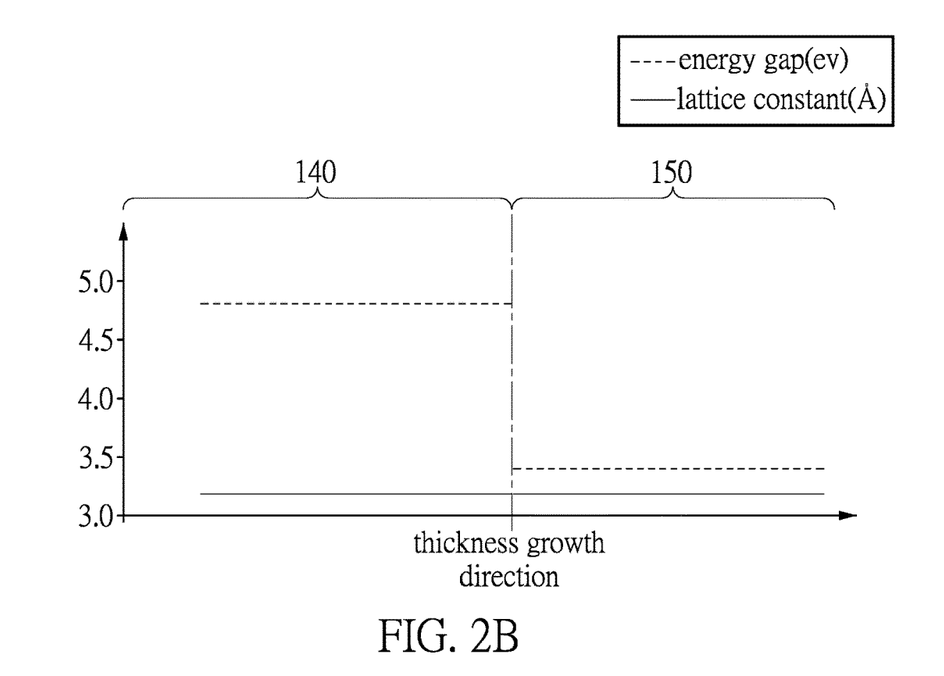
FIG. 2B is a schematic diagram of changes in a lattice constant and an energy gap of the partial of the epitaxial structure of FIG. 2A.

According to the above configuration, as shown in FIG. 2B, the second lattice constant of the diffusion barrier layer 140 is usually 3.2±0.3 Å, preferably 3.2±0.15 Å, and more preferably 3.2±0.1 Å. Furthermore, the energy gap of the diffusion barrier layer 140 is usually 4.8±0.2 eV, preferably 4.8±0.1 eV, and more preferably 4.8±0.05 Å.

Referring further to FIG. 2A, the chemical composition of the P-type gallium nitride layer 150 includes aluminum gallium nitride (AlGaN). The gallium (Ga) content is a fixed value, and the gallium (Ga) content is preferably between 80% and 100%, and more preferably between 90% and 100%. The aluminum (Al) content is also a fixed value, and the aluminum (Al) content is preferably between 0% and 20%, and more preferably between 0% and 10%. In addition, a sum of the gallium (Ga) content and the aluminum (Al) content is 100%.

The gallium (Ga) content and the nitrogen (N) content in the P-type gallium nitride (P-GaN) layer 150 have a fixed proportional relationship, such as 1:1.

In addition, the P-type gallium nitride layer 150 is a single-layer structure, and a total thickness of the P-type gallium nitride layer 150 is usually not less than 30 nanometers, preferably between 30 nanometers and 100 nanometers, and more preferably between 50 nanometers and 80 nanometers.

Furthermore, the P-type gallium nitride layer 150 is doped with an acceptor doping element. The acceptor doping element is at least one material selected from a group consisting of magnesium (Mg), carbon (C), calcium (Ca), iron (Fe), chromium (Cr), vanadium (V), manganese (Mn), and beryllium (Be). In the present embodiment, the acceptor doping element is preferably magnesium (Mg).

In the P-type gallium nitride layer 150, a doping concentration of the acceptor doping element is greater than $1 \times 10^{18}$ atoms per cubic centimeter, preferably between $1\times10^{18}$ and $1\times10^{20}$ atoms per cubic centimeter, and more preferably between $1\times10^{19}$ and $5\times10^{19}$ atoms per cubic centimeter.

It is worth mentioning that, a conventional epitaxial structure affects an electronic behavior in a channel layer (channel GaN layer) due to a deeper diffusion depth of an acceptor doping element, thereby affecting component characteristics of a power component. Furthermore, an etching speed of a P-type gallium nitride layer of the conventional epitaxial structure is generally difficult to control. If an etching depth is too deep, an active layer of the conventional epitaxial structure may be damaged.

Compared with the conventional epitaxial structure, the epitaxial structure E of the present embodiment can provide a diffusion barrier (i.e., blocking the diffusion of Mg atoms to the channel layer) and an etching stop effect (i.e., avoiding damage to the channel layer due to excessive etching depth) by virtue of the diffusion barrier layer 140 disposed between the barrier layer 130 and the P-type gallium nitride layer 150.

In terms of the diffusion barrier, the doping concentration of the acceptor doping element in the diffusion barrier layer 140 is reduced, and is less than the doping concentration of the acceptor doping element in the P-type gallium nitride layer 150. That is, the diffusion barrier layer 140 provides the effect of diffusion barrier.

According to the above configuration, the diffusion depth of the acceptor doping element can be effectively reduced, thereby avoiding affecting the electronic behavior in the channel layer (channel GaN) and improving the device characteristics of the power component.

Figure 3A:
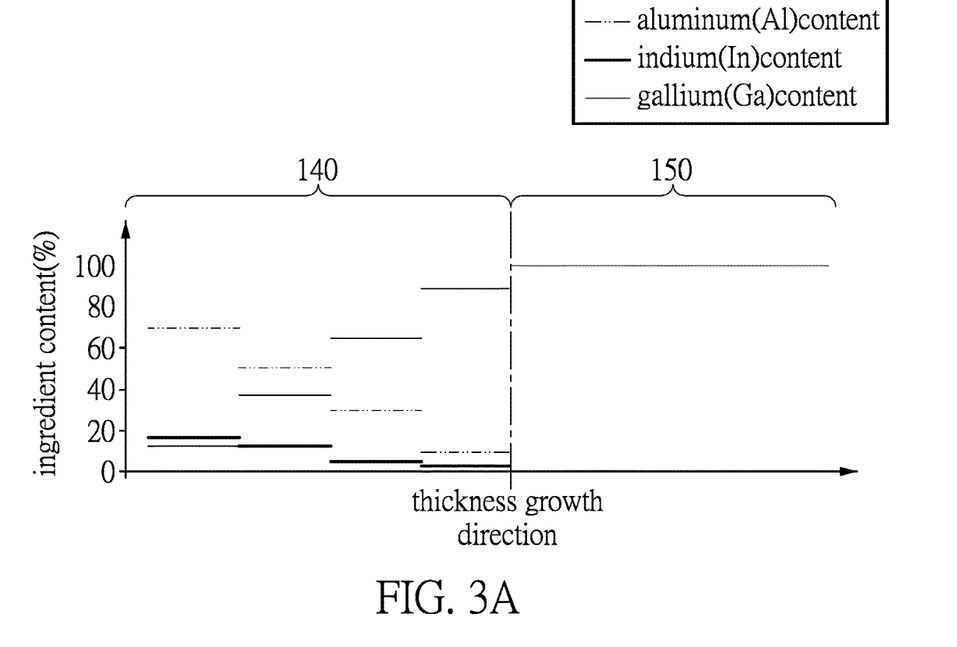
FIG. 3A is a schematic diagram of a second content variation of the chemical composition of the partial of the epitaxial structure of the embodiment along the thickness growth direction.

As shown in FIG. 3A, in the diffusion barrier layer 140, the aluminum (Al) content is decreased in a stepwise manner along the thickness growth direction of the diffusion barrier layer 140. An initial content of the aluminum (Al) content along the thickness growth direction is usually between 60% and 80%, preferably between 70% and 75%, and more preferably between 71% and 73%. A final content of the aluminum (Al) content along the thickness growth direction is usually between 0% and 20%, preferably between 10% and 15%, and more preferably between 11% and 13%.

The indium (In) content is decreased in a stepwise manner along the thickness growth direction of the diffusion barrier layer 140. An initial content of the indium (In) content along the thickness growth direction is usually between 10% and 25%, preferably between 15% and 20%, and more preferably between 16% and 18%. A final content of the indium (In) content along the thickness growth direction is usually between 0% and 10%, preferably between 0% and 5%, and more preferably between 2% and 4%.

The gallium (Ga) content is increased in a stepwise manner along the thickness growth direction of the diffusion barrier layer 140. An initial content of the gallium (Ga) content along the thickness growth direction is usually between 10% and 30%, preferably between 15% and 25%, and more preferably between 19% and 21%. A final content of the indium (In) content along the thickness growth direction is usually between 80% and 100%, preferably between 80% and 90%, and more preferably between 84% and 86%.

Further, the diffusion barrier layer 140 of FIG. 3A is a multi-layer structure, and the quantity of layers of the diffusion barrier layer 140 is usually between 2 and 10 layers, preferably between 2 and 5 layers, and more preferably 2 layers. Furthermore, a total thickness of the diffusion barrier layer 140 is usually between 2 nanometers and 10 nanometers, preferably between 2 nanometers and 5 nanometers, and more preferably 2 nanometers.

It is worth mentioning that the term "increased in a stepwise manner" or "decreased in a stepwise manner" respectively refer to the content of the above-mentioned elements being "gradually increased step by step" or "gradually decreased step by step" along the thickness growth direction.

For example, each ingredient content (%) shown in FIG. 3A has four stepped sections, but the present disclosure is not limited thereto. The quantity of the stepped sections can be changed according to design requirements, and the stepped sections represent the quantity of layers of the diffusion barrier layer 140.

Furthermore, the quantity of the stepped sections may be, for example, two to ten, and in each of the stepped sections, the aluminum (Al) content, the indium (In) content, and the gallium (Ga) content remain unchanged.

In addition, a step change rate of the aluminum (Al) content is generally reduced by 5% to 25% per step, preferably reduced by 10% to 20% per step, and more preferably reduced by 14% to 16% per step. A step change rate of the indium (In) content is usually reduced by 1% to 10% per step, preferably reduced by 2% to 5% per step, and more preferably reduced by 2% to 4% per step. Moreover, the step change rate of the gallium (Ga) content is usually increased by 10% to 30% per step, preferably increased by 15% to 25% per step, and more preferably increased by 19% to 21% per step.

Furthermore, the changing manner of the gallium (Ga) content in the P-type gallium nitride layer 150 of the present embodiment is similar to the changing manner of FIG. 2A, and will not be reiterated herein.

Figure 3B:
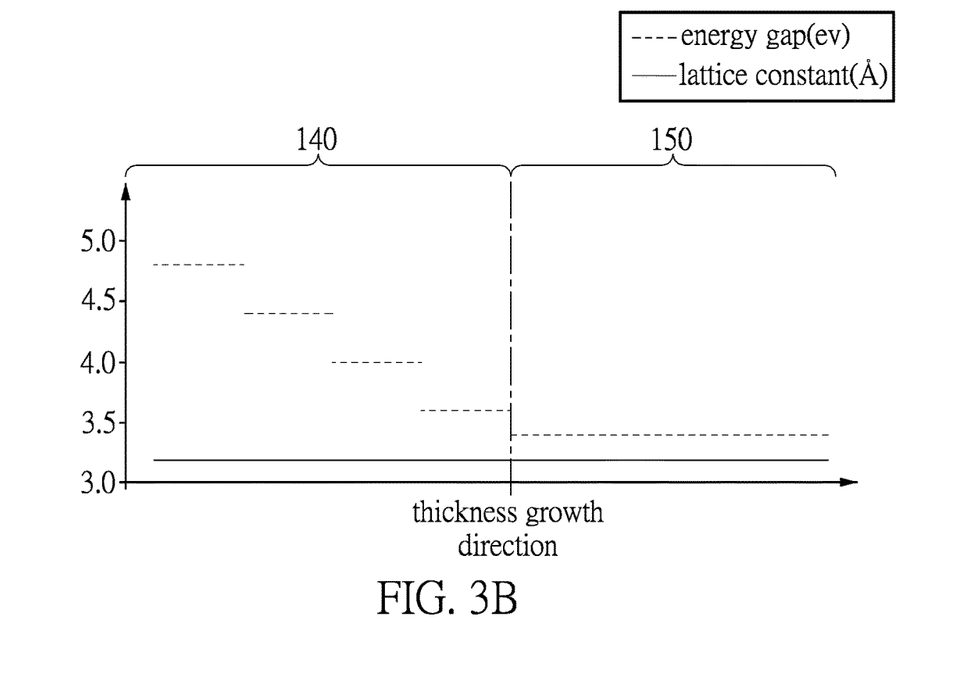
FIG. 3B is a schematic diagram of changes in the lattice constant and the energy gap of the partial of the epitaxial structure of FIG. 3A.

According to the above configuration, as shown in FIG. 3B, the second lattice constant of the diffusion barrier layer 140 is a fixed value, which is usually 3.2±0.3 Å, preferably 3.2±0.15 Å, and more preferably 3.2±0.1 Å Furthermore, the energy gap of the diffusion barrier layer 140 is decreased in a stepwise manner as the aluminum (Al) content is decreased. An initial energy gap of the diffusion barrier layer 140 along the thickness growth direction is usually 5.0±0.2 eV, preferably 4.8±0.15 eV, and more preferably 4.8±0.1 eV. Å final energy gap of the diffusion barrier layer 140 along the thickness growth direction is usually 3.5±0.2 eV, preferably 3.5±0.15 eV, and more preferably 3.5±0.1 eV. In addition, the final energy gap of the diffusion barrier layer 140 is close to the energy gap of the P-type gallium nitride layer 150.

Figure 4A:
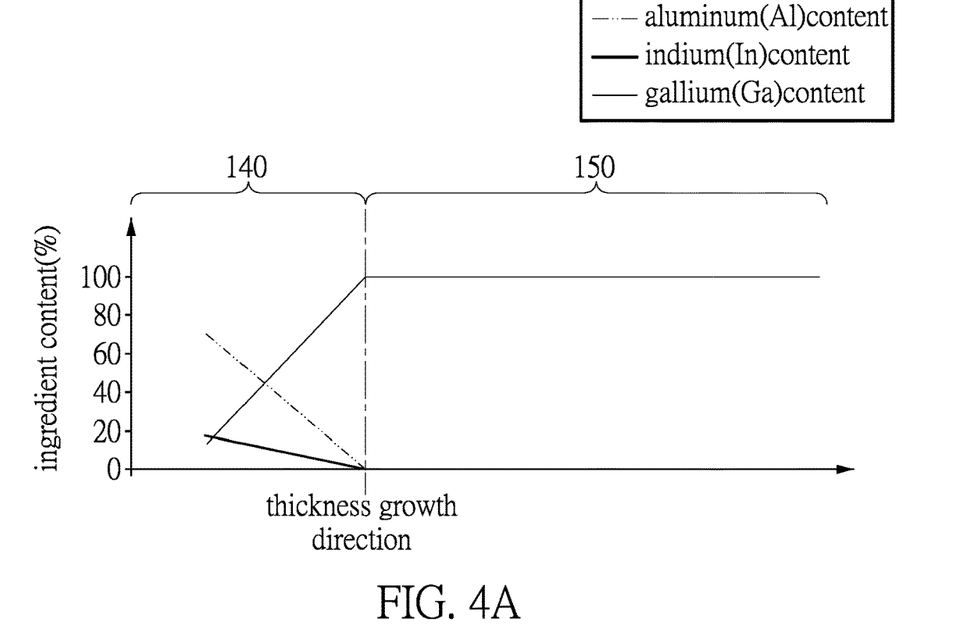
FIG. 4A is a schematic diagram of a third content variation of the chemical composition of the partial of the epitaxial structure of the embodiment along the thickness growth direction.

As shown in FIG. 4A, the aluminum (Al) content is linearly decreased in a gradual manner along the thickness growth direction of the diffusion barrier layer 140. An initial content of the aluminum (Al) content is usually between 60% and 80%, preferably between 70% and 75%, and more preferably between 71% and 73%. A final content of the aluminum (Al) content is usually between 0% and 20%, preferably between 0% and 10%, and more preferably between 4% and 6%.

The indium (In) content is linearly decreased in a gradual manner along the thickness growth direction of the diffusion barrier layer 140. An initial content of the indium (In) content is usually between 10% and 25%, preferably between 15% and 20%, and more preferably between 16% and 18%. A final content of the indium (In) content is usually between 0% and 10%, preferably between 0% and 5%, and more preferably between 2% and 4%.

The gallium (Ga) content is linearly increased in a gradual manner along the thickness growth direction of the diffusion barrier layer 140. An initial content of the gallium (Ga) content is usually between 10% and 30%, preferably between 10% and 20%, and more preferably between 14% and 16%. A final content of the gallium (Ga) content is usually between 80% and 100%, preferably between 90% and 100%, and more preferably between 94% and 96%.

It should be noted that, changes in the contents of aluminum (Al), indium (In), and gallium (Ga) in FIG. 4A are in a gradual increasing manner or in a gradual decreasing manner. The "gradual increase" or "gradual decrease" refers to the "continuous increase" or "continuous decrease" of the contents of the above-mentioned ingredients along the thickness growth direction, respectively.

Furthermore, a gradual slope of the aluminum (Al) content is usually reduced by 8% to 40% per nanometer, preferably reduced by between 10% and 30% per nanometer, and more preferably reduced by between 19% and 21% per nanometer. A gradual slope of the indium (In) content is usually reduced by 2% to 10% per nanometer, preferably reduced by between 5% and 8% per nanometer, and more preferably reduced by between 6% and 8% per nanometer. A gradual slope of the gallium (Ga) content is usually increased by between 10% and 50% per nanometer, preferably increased by between 20% and 50% per nanometer, and more preferably increased by between 34% and 36% per nanometer.

Furthermore, the diffusion barrier layer 140 of FIG. 4A is a single-layer structure. In addition, a total thickness of the diffusion barrier layer 140 is usually between 2 nanometers and 10 nanometers, preferably between 2 nanometers and 5 nanometers, and more preferably 2 nanometers.

Furthermore, the changing manner of the gallium (Ga) content in the P-type gallium nitride layer 150 of the present embodiment is similar to the changing manner of FIG. 2A, and will not be reiterated herein.

Figure 4B:
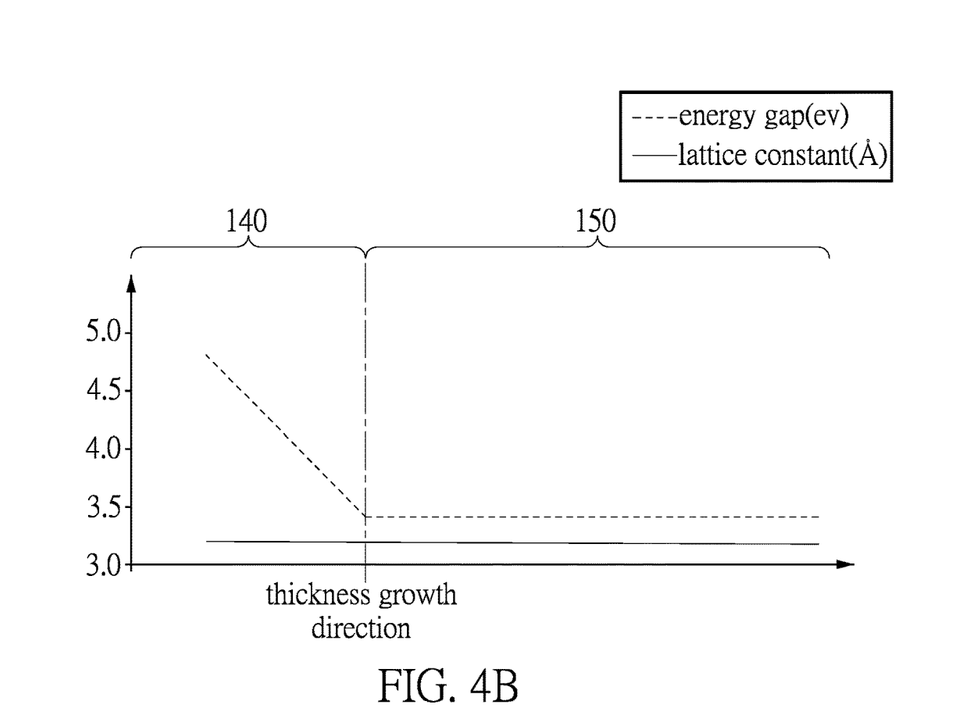
FIG. 4B is a schematic diagram of changes in the lattice constant and the energy gap of the partial of the epitaxial structure of FIG. 4A.

According to the above configuration, as shown in FIG. 4B, the second lattice constant of the diffusion barrier layer 140 is a fixed value, which is usually 3.2±0.3 Å, preferably 3.2±0.15 Å, and more preferably 3.2±0.1 Å. Furthermore, the energy gap of the diffusion barrier layer 140 is linearly decreased in a gradual manner as the aluminum (Al) content is decreased. An initial energy gap of the diffusion barrier layer 140 along the thickness growth direction is usually 5.0±0.2 eV, preferably 4.8±0.15 eV, and more preferably 4.8±0.1 eV. A final energy gap of the diffusion barrier layer 140 along the thickness growth direction is usually 3.5±0.2 eV, preferably 3.4±0.15 eV, and more preferably 3.4±0.1 eV. In addition, the final energy gap of the diffusion barrier layer 140 is close to the energy gap of the P-type gallium nitride layer 150.

Figure 5A:
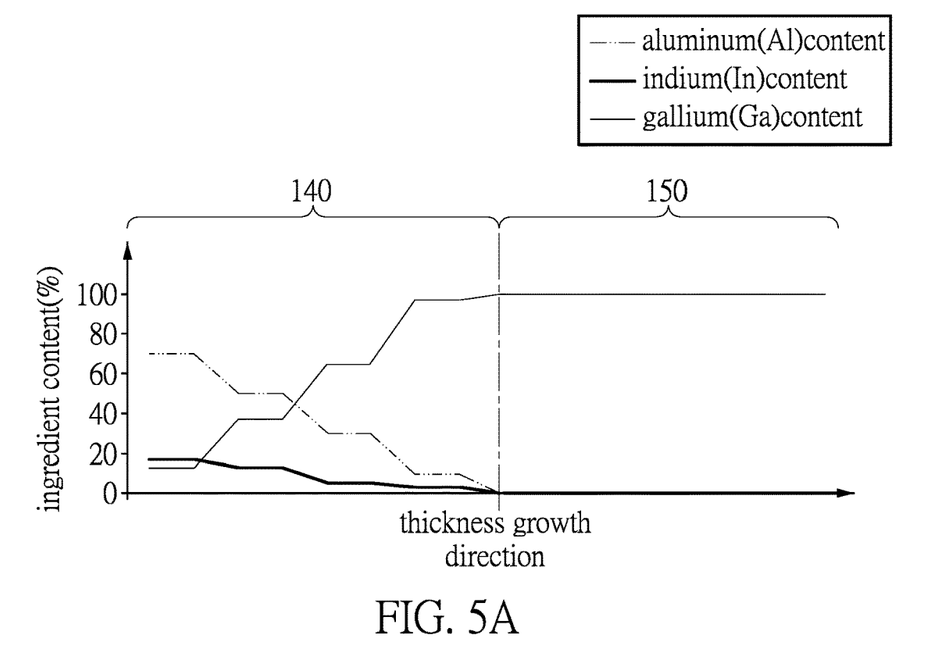
FIG. 5A is a schematic diagram of a fourth content variation of the chemical composition of the partial of the epitaxial structure of the embodiment along the thickness growth direction.

As shown in FIG. 5A, the aluminum (Al) content is decreased along the thickness growth direction of the diffusion barrier layer 140 in a stepwise and gradual interlacing manner. An initial content of the aluminum (Al) content along the thickness growth direction is usually between 60% and 80%, preferably between 70% and 75%, and more preferably between 71% and 73%. A final content of the aluminum (Al) content is usually between 0% and 20%, preferably between 10% and 15%, and more preferably between 11% and 13%.

The indium (In) content is decreased along the thickness growth direction of the diffusion barrier layer 140 in a stepwise and gradual interlacing manner. An initial content of the indium (In) content along the thickness growth direction is usually between 10% and 25%, preferably between 15% and 20%, and more preferably between 16% and 18%. A final content of the indium (In) content is usually between 0% and 10%, preferably between 0% and 5%, and more preferably between 2% and 4%.

The gallium (Ga) content is increased along the thickness growth direction of the diffusion barrier layer 140 in a stepwise and gradual interlacing manner.

An initial content of the gallium (Ga) content along the thickness growth direction is usually between 10% and 30%, preferably between 15% and 25%, and more preferably between 19% and 21%. A final content of the gallium (Ga) content is usually between 80% and 100%, preferably between 80% and 90%, and more preferably between 84% and 86%.

The term "stepwise and gradual interlacing manner" means that the content change of the ingredients is composed of alternating stepped sections and gradual sections, the ingredient contents of the stepped sections are fixed values, and the ingredient contents of the gradual sections are gradually increased or gradually decreased.

For example, each ingredient content (%) shown in FIG. 5A has four stepped sections and four gradual sections, but the present disclosure is not limited thereto. The quantity of the stepped sections and the quantity of the gradual sections can be changed according to design requirements.

Furthermore, the numerical ranges of the stepped slopes and gradual slopes of the aluminum (Al) content, indium (In) content, and gallium (Ga) content are similar to the numerical ranges of FIG. 3A and FIG. 4A, and will not be reiterated herein.

Furthermore, the diffusion barrier layer 140 of FIG. 5A is a multi-layer structure, and a quantity of layers of the diffusion barrier layer 140 is usually between 2 and 10 layers, preferably between 2 and 5 layers, and more preferably 2 layers. Furthermore, a total thickness of the diffusion barrier layer 140 is usually between 2 nanometers and 10 nanometers, preferably between 2 nanometers and 5 nanometers, and more preferably 2 nanometers.

Furthermore, the changing manner of the gallium (Ga) content in the P-type gallium nitride layer 150 of the present embodiment is similar to the changing manner of FIG. 2A, and will not be reiterated herein.

Figure 5B:
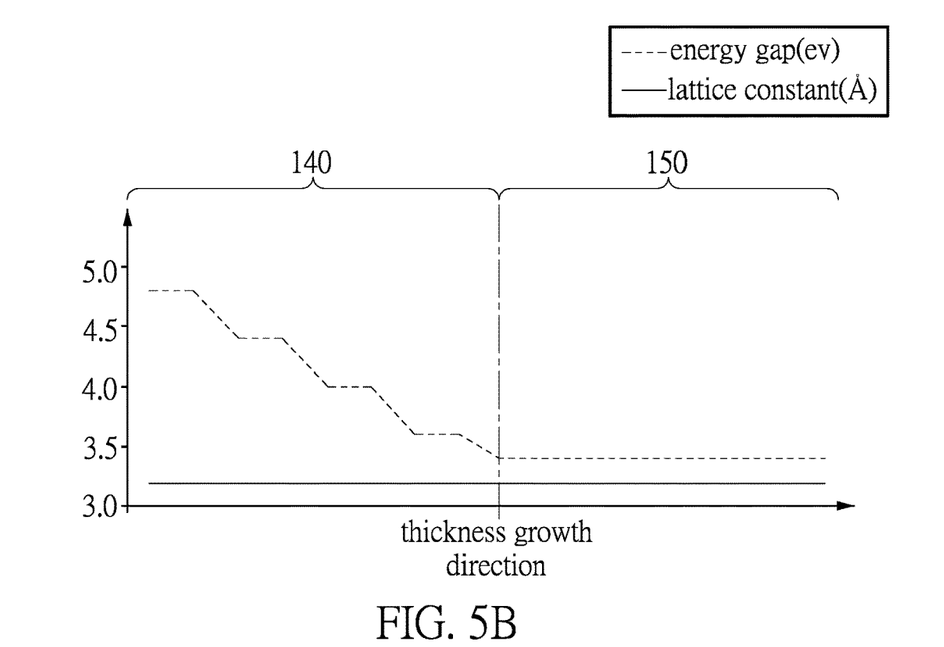
FIG. 5B is a schematic diagram of changes in the lattice constant and the energy gap of the partial of the epitaxial structure of FIG. 5A.

According to the above configuration, as shown in FIG. 5B, the second lattice constant of the diffusion barrier layer 140 is a fixed value, which is usually 3.2±0.3 Å, preferably 3.2±0.15 Å, and more preferably 3.2±0.1 Å. Furthermore, the energy gap of the diffusion barrier layer 140 is decreased in a stepwise and gradual interlacing manner as the aluminum (Al) content is decreased. An initial energy gap of the diffusion barrier layer 140 along the thickness growth direction is usually 5.0±0.2 eV, preferably 4.8±0.15 eV, and more preferably 4.8±0.1 eV. A final energy gap of the diffusion barrier layer 140 along the thickness growth direction is usually 3.5±0.2 eV, preferably 3.4±0.15 eV, and more preferably 3.4±0.1 eV. In addition, the final energy gap of the diffusion barrier layer 140 is close to the energy gap of the P-type gallium nitride layer 150.

Figure 6A:
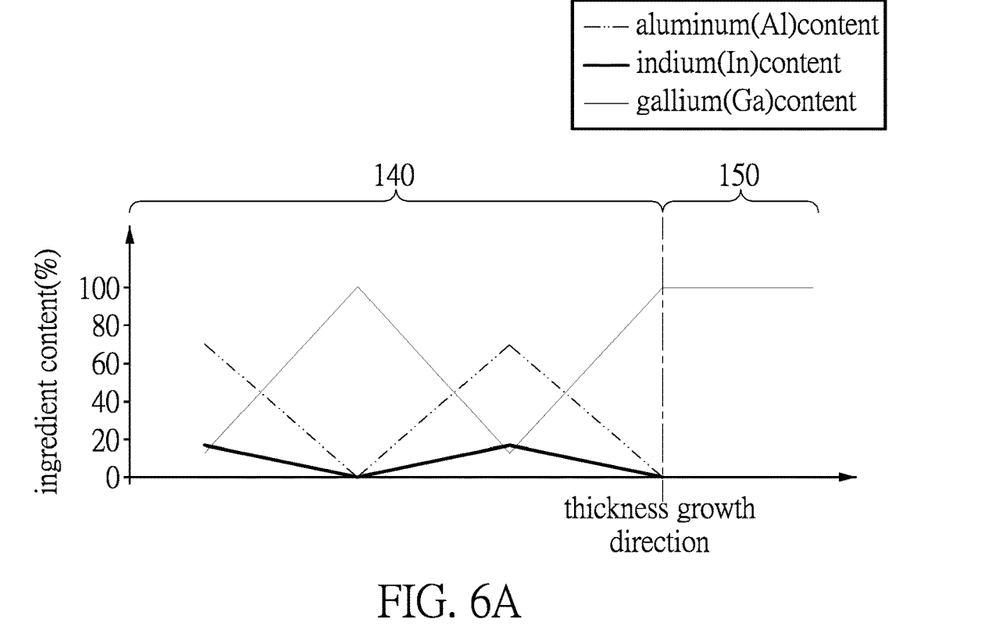
FIG. 6A is a schematic diagram of a fifth content variation of the chemical composition of the partial of the epitaxial structure of the embodiment along the thickness growth direction.

As shown in FIG. 6A, the aluminum (Al) content is decreased along the thickness growth direction of the diffusion barrier layer 140 in a high and low oscillation mariner. An initial content of the aluminum (Al) content along the thickness growth direction is usually between 60% and 80%, preferably between 70% and 75%, and more preferably between 71% and 73%. A final content of the aluminum (Al) content is usually between 0% and 20%, preferably between 0% and 10%, and more preferably between 4% and 6%.

The indium (In) content is decreased along the thickness growth direction of the diffusion barrier layer 140 in a high and low oscillation mariner. An initial content of the indium (In) content along the thickness growth direction is usually between 10% and 25%, preferably between 15% and 20%, and more preferably between 16% and 18%. A final content of the indium (In) content is usually between 0% and 10%, preferably between 0% and 5%, and more preferably between 2% and 4%.

The gallium (Ga) content is increased along the thickness growth direction of the diffusion barrier layer 140 in a high and low oscillation manner. An initial content of the gallium (Ga) content along the thickness growth direction is usually between 10% and 30%, preferably between 10% and 20%, and more preferably between 14% and 16%. A final content of the gallium (Ga) content is usually between 80% and 100%, preferably between 90% and 100%, and more preferably between 94% and 96%.

The term "high and low oscillation manner" means that the ingredient contents repeatedly appear high content and low content variations along the thickness growth direction.

For example, each ingredient content (%) shown in FIG. 6A has two high contents and two low contents that are staggered and repeated, but the present disclosure is not limited thereto. The quantity of the high contents and low contents can be changed according to design requirements.

Furthermore, the numerical ranges of the gradual slopes of the aluminum (Al) content, the indium (In) content, and the gallium (Ga) content are similar to the numerical ranges of FIG. 3A, and will not be reiterated herein.

Furthermore, the diffusion barrier layer 140 of FIG. 6A is a single-layer structure, and a total thickness of the diffusion barrier layer 140 is usually between 2 nanometers and 10 nanometers, preferably between 2 nanometers and 5 nanometers, and more preferably 2 nanometers.

Furthermore, the changing manner of the gallium (Ga) content in the P-type gallium nitride layer 150 of the present embodiment is similar to the changing manner of FIG. 2A, and will not be reiterated herein.

Figure 6B:
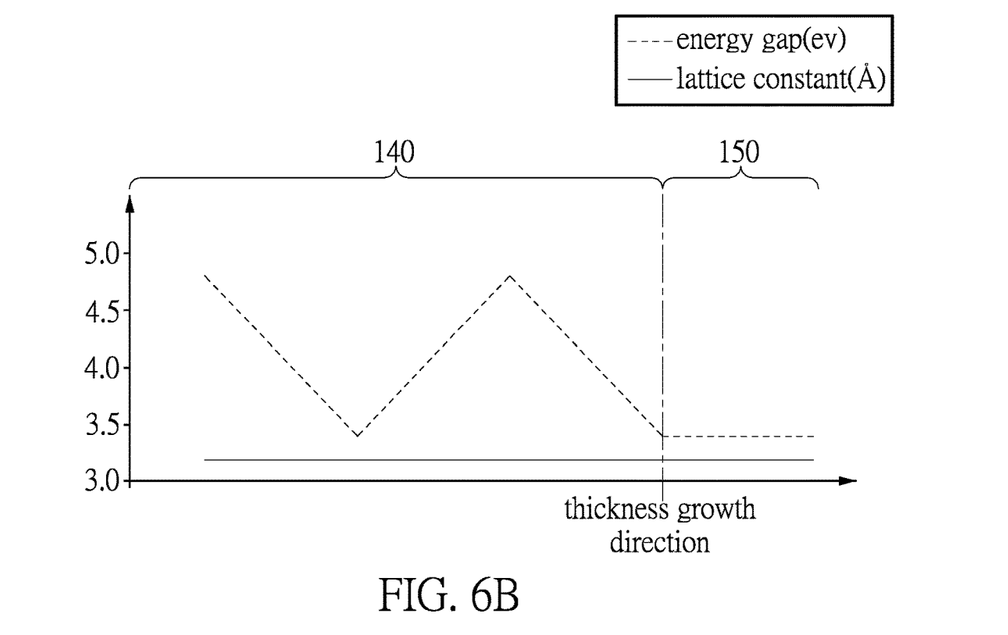
FIG. 6B is a schematic diagram of changes in the lattice constant and the energy gap of the partial of the epitaxial structure of FIG. 6A.

According to the above configuration, as shown in FIG. 6B, the second lattice constant of the diffusion barrier layer 140 is a fixed value, which is usually 3.2±0.3 Å, preferably 3.2±0.15 Å, and more preferably 3.2±0.1 Å. Furthermore, the energy gap of the diffusion barrier layer 140 is decreased in a high and low oscillation manner as the aluminum (Al) content is decreased. An initial energy gap of the diffusion barrier layer 140 along the thickness growth direction is usually 5.0±0.2 eV, preferably 4.8±0.15 eV, and more preferably 4.8±0.1 eV. A final energy gap of the diffusion barrier layer 140 along the thickness growth direction is usually 3.5±0.2 eV, preferably 3.4±0.15 eV, and more preferably 3.4±0.1 eV. In addition, the final energy gap of the diffusion barrier layer 140 is close to the energy gap of the P-type gallium nitride layer 150.

It is worth mentioning that in the above-mentioned FIG. 2A to FIG. 6A, the changes in the contents of aluminum (Al), indium (In), and gallium (Ga) in the diffusion barrier layer 140 can also be presented in an inverted manner.

For example, in an embodiment that is not illustrated in the drawings, the aluminum (Al) content in the diffusion barrier layer is increased along the thickness growth direction of the diffusion barrier layer. An initial content of the aluminum (Al) content along the thickness growth direction is between 0% and 20%, and a final content is between 60% and 80%. The indium (In) content is increased along the thickness growth direction of the diffusion barrier layer, an initial content of the indium (In) content along the thickness growth direction is between 0% and 10%, and a final content is between 10% and 25%. The gallium (Ga) content is decreased along the thickness growth direction of the diffusion barrier layer, an initial content of the gallium (Ga) content is between 80% and 100%, and a final content is between 10% and 30%.

The diffusion barrier layer has a single-layer structure or a multi-layer structure, and a total thickness of the diffusion barrier layer is between 2 nanometers and 10 nanometers. Furthermore, the second lattice constant of the diffusion barrier layer is 3.2±0.3 Å, an initial energy gap of the diffusion barrier layer is 3.5±0.2 eV, and a final energy gap is 5.0±0.2 eV.

It is worth mentioning that the method for increasing or decreasing the content can be, for example, stepwise, gradual, interlaced stepwise and gradual, or high and low oscillations, and the present disclosure is not limited thereto.

Beneficial Effects of the Embodiment

In conclusion, by virtue of "a diffusion barrier layer being disposed between the barrier layer and the P-type gallium nitride layer, the diffusion barrier layer including a chemical composition of $In_{x1}Al_{y1}Ga_{z1}N$, where $x1+y1+z1=1$, $0 \le x1 \le 0.3$, $0 \le y1 \le 1.0$, and $0 \le z1 \le 1.0$; in which the chemical composition of the diffusion barrier layer has a proportional relationship, so that the diffusion barrier layer has a second lattice constant that matches the first lattice constant, and the second lattice constant is between 80% and 120% of the first lattice constant", the epitaxial structure of the present disclosure enables an internal stress between the diffusion barrier layer and the P-type gallium nitride layer to be effectively reduced, and the epitaxial structure can have good epitaxial quality, thereby having good electrical characteristics.

Furthermore, the epitaxial structure of the present disclosure can achieve a diffusion barrier (i.e., blocking the diffusion of Mg atoms to the channel layer) and an etching stop effect (i.e., avoiding damage to the channel layer due to excessive etching depth), thereby effectively improving the component characteristics of power components.

From another perspective, by virtue of "the diffusion barrier layer and the modulation of chemical composition $In_{x1}Al_{y1}Ga_{z1}N$", the epitaxial structure of the present disclosure enables Mg atoms to be not easily diffused into the active layer in large quantities, and the higher etching uniformity and stability at the end of the device manufacturing process can also be achieved due to the difference in etching rate.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An epitaxial structure, comprising:
   a substrate;
   a buffer layer disposed on the substrate;
   a channel layer disposed on the buffer layer;
   a barrier layer disposed on the channel layer; and a P-type gallium nitride layer disposed on the barrier layer, and the P-type gallium nitride layer having a first lattice constant;

wherein the epitaxial structure further comprises a diffusion barrier layer disposed between the barrier layer and the P-type gallium nitride layer, the diffusion barrier layer includes a chemical composition of $In_{x1}Al_{y1}Ga_{z1}N$, where $x1+y1+z1=1$, $0 \leq x1 \leq 0.3$, $0 \leq y1 \leq 1.0$, and $0 \leq z1 \leq 1.0$; wherein the chemical composition of the diffusion barrier layer has a proportional relationship, so that the diffusion barrier layer has a second lattice constant that matches the first lattice constant, and the second lattice constant is between 80% and 120% of the first lattice constant;

wherein the barrier layer includes a chemical composition of $Al_{y2}Ga_{z2}N$, where $y2+z2=1$, $0.1 \leq y2 \leq 0.3$, and $0<z2<1$;

wherein the diffusion barrier layer including the chemical composition of $In_{x1}Al_{y1}Ga_{z1}N$ is directly disposed on and connected to the barrier layer including the chemical composition of $Al_{y2}Ga_{z2}N$;

wherein at least a part of the aluminum (Al) content of the diffusion barrier layer is not less than 0.4 and is greater than the aluminum (Al) content of the barrier layer;

wherein the diffusion barrier layer is a multi-layer structure that has four layers to ten layers, and the aluminum (Al) content of the diffusion barrier layer is decreased along a thickness growth direction of the diffusion barrier layer; wherein an initial content of the aluminum (Al) content along the thickness growth direction is between 60% and 80%, a final content of the aluminum (Al) content along the thickness growth direction is between 0% and 20%, and a step change rate of the aluminum (Al) content in the multi-layer structure is reduced by 5% to 25% per step.

2. The epitaxial structure according to claim 1, wherein the first lattice constant of the P-type gallium nitride layer is 3.2±0.3 Å, and the second lattice constant of the diffusion barrier layer is 3.2±0.3 Å.

3. The epitaxial structure according to claim 1, wherein, in the diffusion barrier layer, the proportional relationship of the chemical composition is:

y1 and x1 satisfy the following relationship: $y1=k1*x1$, where $2 \leq k1 \leq 8$; and y1 and z1 satisfy the following relationship: $y1*z1=k2$, where $0.05 \leq k2 \leq 0.3$.

4. The epitaxial structure according to claim 1, wherein, in the diffusion barrier layer, at least the part of the aluminum (Al) content enables a maximum energy gap of the diffusion barrier layer to be not less than 4.6 eV.

5. The epitaxial structure according to claim 1, wherein, in the diffusion barrier layer, an initial content of the indium (In) content along the thickness growth direction is between 10% and 25%, and a final content of the indium (In) content along the thickness growth direction is between 0% and 10%; wherein an initial content of the gallium (Ga) content along the thickness growth direction is between 10% and 30%, and a final content of the gallium (Ga) content along the thickness growth direction is between 80% and 100%.

6. The epitaxial structure according to claim 5, wherein an energy gap of the diffusion barrier layer is decreased in a stepwise manner the second lattice constant of the diffusion barrier layer is 3.2±0.3 Å, an initial energy gap of the diffusion barrier layer along the thickness growth direction is 5.0±0.2 eV, and an final energy gap of the diffusion barrier layer along the thickness growth direction is 3.5±0.2 eV.

7. The epitaxial structure according to claim 1, wherein the P-type gallium nitride layer includes an acceptor doping element with a doping concentration greater than $1 \times 10^{18}$ atoms per cubic centimeter; wherein the acceptor doping element is at least one material selected from a group consisting of magnesium (Mg), carbon (C), calcium (Ca), iron (Fe), chromium (Cr), vanadium (V), manganese (Mn), and beryllium (Be).

* * * * *